(12) United States Patent
Zhu

(10) Patent No.: US 7,752,697 B2
(45) Date of Patent: Jul. 13, 2010

(54) SEALED BOX APPARATUS FOR POOL CLEANING MACHINE

(75) Inventor: Dao Qiang Zhu, Koolong (HK)

(73) Assignee: Smartpool, Inc., Lakewood, NJ (US)

( * ) Notice: Subject to any disclaimer, the term of this patent is extended or adjusted under 35 U.S.C. 154(b) by 781 days.

(21) Appl. No.: 11/698,210

(22) Filed: Jan. 26, 2007

(65) Prior Publication Data
US 2007/0251859 A1 Nov. 1, 2007

(51) Int. Cl.
*E04H 4/16* (2006.01)
*B65D 85/86* (2006.01)
(52) U.S. Cl. .......................... 15/1.7; 206/706
(58) Field of Classification Search ............... 15/1.7; 206/706
See application file for complete search history.

(56) References Cited
U.S. PATENT DOCUMENTS 5,183,966 A * 2/1993 Hurtado et al. ............. 174/20
5,219,075 A * 6/1993 White ...................... 206/314
2003/0136705 A1* 7/2003 Roth ....................... 206/582

* cited by examiner

*Primary Examiner*—Randall Chin
(74) *Attorney, Agent, or Firm*—Birch, Stewart, Kolasch & Birch, LLP

(57) ABSTRACT

The present invention relates to a sealed box apparatus for a pool cleaning machine wherein the sealed box is installed inside the body of the pool cleaning machine. The box contains and seals electronic devices for the cleaning machine. At least one waterproofed tube is provided for inputting and outputting wires for connecting the electronic devices sealed inside the box with peripherals. A transparent portion is installed on one side of the box. A humidity display is installed inside the box, and corresponds to the position of the transparent portion. The sealed box provides an excellent airproof seal for protecting the inside electronic circuits from being waterlogged, and to provide excellent heat elimination, while leakage into the sealed box may be conveniently monitored in real-time.

22 Claims, 5 Drawing Sheets

SEALED BOX APPARATUS FOR POOL CLEANING MACHINE

BACKGROUND OF THE INVENTION

The present application claims priority of China Application No. 200610002331.4 filed in China on Jan. 26, 2006 under 35 U.S.C. §119; the entire contents of all are hereby incorporated by reference.

1. Field of the Invention

The present invention relates to a seal for a box. More particularly, to a seal for a box used together with an underwater mechanical apparatus for waterproofing an electronic circuit, for reinforcing heat elimination, and for displaying a water leakage condition.

2. Description of Background Art

Normally, traditional cleaning machines used in swimming pools employ a motor to power a water pump and for driving the cleaning machine. These machines usually have an output power of about 50 w~200 w. For easy control of the functions of the machine, it is an advantage to install the electronic devices inside the body of the cleaning machine. However, the capacity of the cleaning machine is limited. In addition, the size of the container for the circuit is also limited. Even with heat-generated in an amount of 10 W, the problems will occur with regard to an increase in the temperature and plastic transmuting. In order to solve the problem of heat elimination, traditionally, a metal piece is set on the bottom of the board that is equipped with the electronic devices. Thus, as the metal piece contacts the water in the swimming pool, the heat will be eliminated. Another method is to increase the size of the container for placing the circuit board, thus to increase the cross-ventilation for reducing the temperature.

In some countries or regions with plentiful sunshine throughout the year, the use and maintenance of a private swimming pool will involve automatic home swimming pool cleaning machines. At night or when no one is using the swimming pool, an automatic swimming pool cleaning machine will be activated to patrol the bottom surface and side walls, to clean debris in the pool and dirt on the side walls. Some of the cleaning machines are driven by a motor or employs a motor to pump water. However, electrical circuits and elements for controlling the motor or other electronic devices are required to be kept underwater in a sealed box. Thus, the sealed box should be waterproof to protect the electronic devices therein.

In the prior art, the boxes used for the equipment are made of plastic. A piece of metal is installed therein to contact with the electrically controlled bottom board and to extend to the outside of the plastic box to eliminate heat while submerged in water.

In the prior art, the plastic box includes a wire that enters the box and a wire that exits the box. In manufacturing, the electronic devices are placed inside the box and then are sealed it to prevent water from leaking. Actually this kind of apparatus is formed by a box component made of two pieces of plastics. The joint surface between the two pieces of plastic will age and with age over a long period of time will leak and the water leakage will damage the electronic devices therein.

U.S. Pat. No. 5,183,966 discloses a water-proof connection apparatus for an underwater cable for protecting the cable from being affected by sea water. The configuration of the patent cannot protect the circuit board with more restrict waterproof requirements. If the circuit board leaks when being using for a long time, a user cannot estimate the status inside the circuit board without opening the box.

Chinese patent CN 03110486.X discloses a pool cleaning machine, that is electrically controlled or by other controlling circuit devices. However, this patent does not disclose any waterproof method or apparatus to protect the circuit apparatus in the machine.

According to the boxes for a motherboard of an electrically controlled circuit in a traditional cleaning machine, the following defects should be overcome:

The problem of waterproofing and the corruption between the heat elimination metal and the plastic box. If a sealant is applied, as the thermal expansion coefficients of a metal piece and sealant are different. After use over a long time, iterative hot/cold will damage the sealability of the metal. If a sealant is applied between the metal piece and plastic box, when the cleaning machine is used iteratively, erodibility of the water accumulated in the gap will increase. Pools are often sanitized by chlorine. Thus, the water contains a quantity of chlorine ions. When the cleaning machine is pulled out of the pool, part of the water that contains chlorine ion will stay in the gap between the pad and metal. After water is volatilized, the content of the chlorine ions will increase significantly, and after a long time using the machine, the chlorine ions will corrupt the metal, thus damaging the seal.

No matter in what condition or for what reason, in the traditional designs if the seal of the motherboard is damaged due to a leak, the damage to the components on the motherboard are quickly known by the user. However, at this time, it is too late to prevent the damage.

In the traditional designs, even by certain instruments, it is impossible to check to determine if the seal is airproof and in good condition to protect the motherboard. Not only are sensitive instruments required to detect the minor leakage, but also after the detection is finished, it is impossible to detect the sealing ability of the probe's entrance into the box.

The problems relate to the design of the seal on the motherboard. Because the rigidity of plastic box is limited, the seal will be affected by outside force and heat. The market available of waterproof pads or sealants designed with assuming the rigidity and level of the conjugating components continue to change. It is not always a good idea that the sealants cannot match with the special environmental applications.

Electronic controlling components that are affected by dampness will affect the natural operation of the cleaning machine, such deviations will occurs when reversing or changing the ongoing direction of the machine. Without knowing the condition of whether the controlling components were affected with dampness or not, it is difficult to proceed with maintenance and cleaning of the machine.

The problem of humidity relates to the moisture in the air. In an aerographic study, there are different methods for calculating humidity, including vapor pressure in the air. The pressure value is proportional to the content of vapor in air. Another calculation method is a mixing ratio, which is calculating the weight (in grams) of vapor in 1 liter of dry air. Two seldom applied methods relate to specific humidity, which is the ratio of the weight of vapor (in grams) as comparing with the weight of wet air (that is, both dry air and vapor) (in kilograms) and to absolute humidity, which is the weight (in grams) of vapor in 1 cubic meter of dry air. In modern aerographic studies, a method of relative humidity is widely applied. Relative humidity is the ratio of vapor pressure comparing with saturated vapor pressure. Saturated vapor pressure is the pressure that the largest amount of vapor in the air under certain temperatures. More specifically, in a balanced situation, the number of water molecules vaporized in the air from water that is approximately equal to the number of water molecules frozen in the air.

A hygrometer is the most accurate instrument for measuring absolute and relative humidity in modem technology, the earliest inventor is an English meteorologist, John F. Daniell (1790-1845) who invented a dew-point hygrometer, which is referred to as a Daniell hygrometer by meteorologists. The hygrometer is formed by two glass balls connected with a glass tube. The common hygrometer nowadays is a psychrometer, which is formed by two parallel thermometers, one for measuring air temperature, the other for measuring wet-bulb depression in wet cotton. A comparison table is provided to check the relative humidity detected by these two thermometers. Another commonly used hygrometer is a hair hygrometer which utilizes the concept of human hair flexing according to changes in humidity. The hair hygrometer may also be designed as a hygrograph for recording relative humidity automatically.

BRIEF SUMMARY OF THE INVENTION

In accordance with the defects of the prior art, an object of an embodiment of the present invention is directed to providing a sealed box for use with an underwater cleaning machine, wherein the status within the sealed box may be monitored conveniently and in real-time, thus preventing water leakage from damaging the electronic devices in the sealed box.

Another object of an embodiment of the present invention is to provide a sealed box apparatus for a pool cleaning machines that has an excellent airproof performance, which may protect the inside electronic circuits from being waterlogged, and to provide for an excellent heat elimination, while the leakage of the sealed box may be monitored conveniently and in real-time.

According to one embodiment of the present invention, a sealed box apparatus for a pool cleaning machine is provided which is installed inside the body of the pool cleaning machine wherein the sealed box contains and seals the electronic devices of the cleaning machine. At least one waterproof tube is provided for inputting and outputting wires that are connected to the electronic devices sealed inside the box with peripherals. A transparent portion is installed on one side of the box. A humidity display is installed inside the box and corresponds to the position of the transparent portion.

In one embodiment, the humidity display is a humidity displaying paper.

In one embodiment, the humidity display is a hygrometer.

In one embodiment, the humidity displaying paper consists of a highly sensitivity humidity displaying paper and a low sensitivity humidity displaying paper.

In one embodiment, the box is made of a transparent material.

In one embodiment, a control switch is fixed on the box for controlling the electronic devices sealed inside the box.

In one embodiment, the box is set forth in an integrated design.

In one embodiment, the box includes a body and a cover, and the body and cover is closely sealed.

An embodiment of the present invention provides a sealed box apparatus with a humidity display. The humidity display may display the inside humidity of the sealed box, especially when the humidity reaches a degree wherein a negative effect may occur to the electronic devices in the sealed box. In this situation, the humidity display in the present invention will activate an alarm. Therefore, the operator may take action before the electronic devices are affected, to protect the electronic devices from being waterlogged in the sealed box.

The specific feature of the sealed box in the present invention is that the humidity in the box may be monitored from the outside. The display is easy to understand, and the operators do not have to look up any comparison tables. Further, with the assistance of a high sensitivity and a low sensitivity humidity displaying paper, the humidity display of the present invention is very accurate. While maintaining the dryness of the box in operation, a low humidity in the box will not cause a false display to indicate to the operator that there is leakage in the sealed box.

When the sealed box leaks, the humidity in the box reaches a certain level and the electronic devices are subjected to in this humid environment. Thus, the electronic devices will be corrupted by the moisture. The apparatus of the present invention may display the level of danger to stop the operation of the sealed box that is working underwater. Thus, the sealed box may be examined and to repair the electronic devices before they are permanently damaged.

When a sealed box according to an embodiment of the present invention leaks, the humidity displayed may set off an alarm. A spare sealed box with a humidity display apparatus that is equipped therein with appropriate electronic devices in a suitable humidity environment may be installed to permit the pool cleaner machine to continue to be operated underwater.

Further, the sealed box is made of transparent material. Thus, the condition inside the sealed box is clearly visible.

According to another aspect of the present invention, a sealed box apparatus may be used with a pool cleaning machine which is installed inside the body of a pool cleaning machine having a box for containing and sealing electronic devices for the cleaning machine. A box body is provided together with a box cover for hermetically sealing the box body. At least one waterproofed tube is positioned in the box for inputting and outputting wires that connect the electronic devices sealed inside the box with peripherals. A transparent portion is installed on one side of the box. A humidity display is installed inside the box and corresponds to the position of the transparent portion. At least one heat elimination board is installed in the body for eliminating the heat generated by the electronic devices inside the box body.

In one embodiment, a slot is provided on the edge of the box body and a matching slot is provided on the corresponding position of the box cover. In addition, a sealing piece is provided at the copulae of the box body and box cover. Reinforcing screws achieve the sealing engagement of the body and cover.

In one embodiment, a circuit motherboard, a wire, a wire socket, a wire pin and a heat elimination board are installed inside the sealed box. After installation, the motherboard and heat elimination board are positioned to seal the circuit therein. The wire, wire pin and wire socket are used for connecting the motherboard and the wire that enters the sealed box via the wire input/output tube.

In one embodiment, a wall corresponding to the position of wire input/output tube is provided in the box body with a small space being formed between the wall and one side of the body as a connection space for inputting a wire from outside and outputting a wire from inside. After the wires are installed, the space is sealed.

In one embodiment, the wire input from the outside and the wire output from the inside are non-continuous wires, with their soldered portion being sealed after being soldered together.

In one embodiment, the wire input from the outside and the wire output from the inside are continuous wires includes an insulating layer that is peeled. Thereafter, the peeled portion is then sealed.

In one embodiment, the heat elimination board lies on the wall of the box body, wherein the wall of the box body that is near to the heat elimination board is thinner than other walls. Thus, a benefit is achieved for eliminating heat to the water by the heat elimination board.

In one embodiment, the rigidity of the sealing piece is no more than ASTM ShoreA 90 degrees, ASTM ShoreA 35~50 degrees is preferred.

In one embodiment, the transverse section of the sealing piece is in the shape of "H." At least one side of the airproof piece is provided with a slot.

In one embodiment, the humidity display is a humidity displaying paper.

In one embodiment, the humidity display is a hygrometer.

In one embodiment, the box body is made of transparent material.

The sealed box apparatus for a pool cleaning machine according to an embodiment of the present invention seals all of the circuit parts in the sealed box by placing them in the sealed box and then sealing the circuit part in the box body. Thus, damage to the circuit parts caused by the water leakage during use of the cleaning machine is prevented. In order to solve the problem of poor diathermancy of the plastic, a heat elimination board with excellent diathermancy is provided. The heat generated by the electronic components is propagated on the average to increase the heat elimination area to compensate for poor diathermancy of the lower $J/m^2/K$. The configuration of the heat elimination board may also propagate heat generated during the operation of the circuits to the water via the plastic material with poor diathermancy. Thus, the chance that the airproof ability is destroyed as a result of the change of shape caused by over heating in the sealed box is eliminated. The transparent portion and humidity display allows the operator to conveniently check the status of water leakage and to timely maintain the sealed box. Further, as the sealed box is made of transparent material, an operator may check the condition of each component in the box without opening the box. Thus, checking and maintenance are facilitated.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Various aspects of the present invention will be described according to the embodiments as follows, however, the scope of the present invention is not limited to these embodiments.

Figure 1:
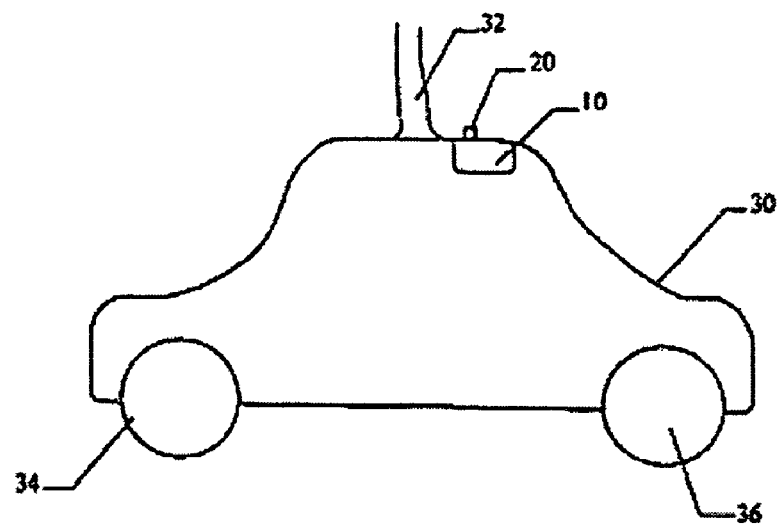
FIG. 1 is a side view of the sealed box apparatus installed in an electronic control designed cleaning machine, in accordance with the present invention.

The sealed box apparatus of the present invention is applicable for water leakage prevention for any circuit system in a mechanism that is required to be used underwater. However, only one representative embodiment of a pool cleaning machine is described in the present invention. As shown in FIG. 1, a pool cleaning machine or other automatic machine that needs to operate underwater includes a body 30, at least two pairs of wheels and a roller installed on both sides 34, 36 of the body 30, that are driven by a motor or other electrical drivers. The sealed box apparatus 10 (hereafter, sealed box) of the present invention is installed on the body 30. The switch or other electrical tuners 20 are installed on a position that may be conveniently operated. An outer power supply system is provided to the sealed box via wire 32.

Figure 2:
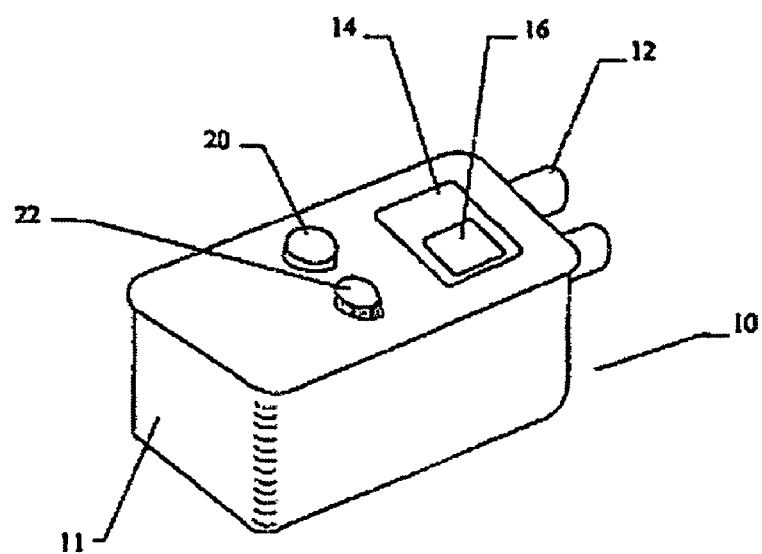
FIG. 2 is the perspective view of the sealed box apparatus in one embodiment of the present invention.

One embodiment of the present invention is illustrated in FIG. 2 wherein a sealed box 10 includes at least one water leaking prevention wire input/output tube 12, for connecting the electronic devices in the box with the outer power supply system and the outer motor or other controlled apparatus. A transparent portion 14 is made of a transparent material that is provided on one side of the sealed box. The size of the transparent portion varies according to users' requirements, or it may form the whole side of the sealed box. A transparent window is shown as the transparent portion in FIG. 2. The transparent portion is manufactured as an indivisible part of box 11. A humidity displaying paper 16 is provided at a position that corresponds to the transparent portion. The humidity displaying paper may display different colors based on different humidity to warn the operator about water leakage in the sealed box 10. Control devices such as a sealed switch 20 or variable resistance tuner 22 etc. may be installed on the sealed box.

Figure 3:
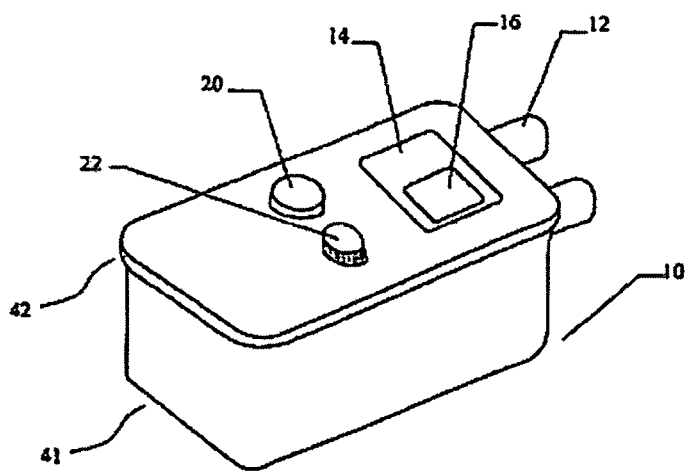
FIG. 3 is the perspective view of the sealed box apparatus in another embodiment of the present invention.

FIG. 3 is another sealed box 10 for waterproofing of the electronic devices in the cleaning machine. The sealed box includes a box body 41 and a box cover 42. The box body and cover may be engaged in various ways to be prevented from leaking, for example, it can employ a flexible rubber piece used as a sealing piece. In the alternative, a screw and nut on the body and cover may be added to engage both parts tightly to form a waterproof environment. Other suitable methods may also be applied in engagement of the body 41 and cover 42. Further, at least one waterproofing wire input/output tube 12 is provided on a box body 41 to connect the inner electronic devices with an outer power supply system and an outer motor or other controlled devices. A transparent portion 14 (a transparent window) made of a transparent material is provided on the box cover, the transparent portion is manufactured as an indivisible part of the box cover 42. A humidity displaying paper 16 is provided at a position corresponding to the transparent portion. The color of the humidity displaying paper will change according to the humidity inside the box to warn the operator of a leak with regard to the sealed box 10. Control devices such as sealed switch 20 or variable resistance tuner 22 etc. may be installed on the sealed box.

The humidity displaying paper using in the abovementioned two examples may be made of filter paper that is cut into a suitable size, around one third of the area of the transparent window 14. The filter paper may be dipped into a cobaltous chloride solution and then dried, thereafter the color will be indigo. The concentration of the cobaltous Chloride solution is about 100 g dry cobaltous chlorides per 1 liter of water. In operation, if the sealed box leaks, the humidity displaying paper 16 will change to the color of a light indigo. With the color changing, it will remind the operator to take action to protect the electronic devices inside the sealed box.

Other similar humidity display apparatus may also be employed and can be placed at the position corresponding to the transparent portion, for example, the humidity display may be an electronic hygrometer, or a simple chemical displaying paper. Such a humidity displaying paper may be made into display papers with different sensitivity according to different concentration with a thinner ratio of chemical compounds. For example, if the sealed box slightly leaks, a high sensitivity displaying paper may be utilized to detect it within one hour. Alternatively, a low sensitivity displaying paper may be utilized to detect a leak within 24 hours. While utilizing high sensitivity displaying paper, leaking in the sealed box may be detected in a short time. However, since the paper is of a high sensitivity, any volatility material on the motherboard will affect the displaying paper, including the glues used on the motherboard. While working with a low sensitivity display paper, the status of sealed box may be determined clearly and exactly. However, it takes more time to sense a leak in the sealed box. In the process of manufacturing the sealed box an individual would examine to see if the high sensitivity displaying paper does not react to thus consider the sealed box as an eligible product. If the high sensitivity display paper reacts, the sealed box will be monitored for 24 hours. If the low sensitivity display paper does not react, the sealed box is considered as an eligible product. If the low sensitivity display paper reacts, the sealed box is not an acceptable product.

The sealed box as shown in FIG. 2, due to its integral configuration, may only be opened in a repair shop.

In the sealed box shown in FIG. 3, screws and nuts may be employed for compressively sealing the box body 41 and cover 42. Home operators or maintenance individuals may change the sealed box and the humidity displaying paper contained therein with simple tools to protect the electronic devices therein.

In one embodiment, the sealed box may be totally made of transparent materials, in this regard, it is easier to monitor and maintain the sealed box.

Figure 4A:
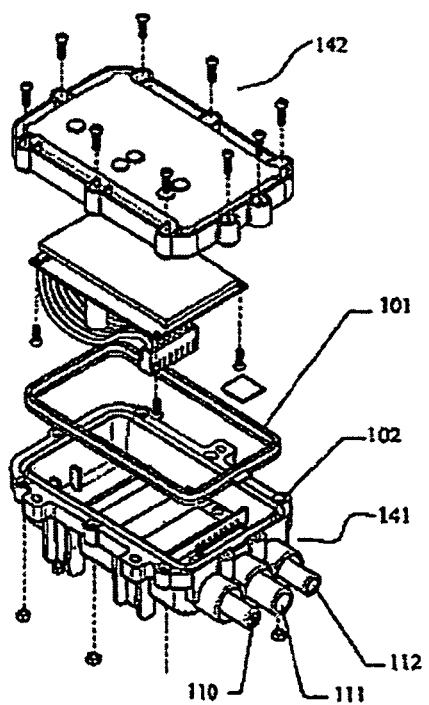
FIG. 4A is the exploded perspective view of the water leakage prevention design of the sealed box apparatus in another embodiment of the present invention.
Figure 4B:
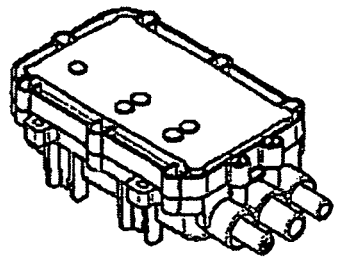
FIG. 4B is the perspective view of the sealed box apparatus in FIG. 4A, in accordance with the present invention.
Figure 4C:
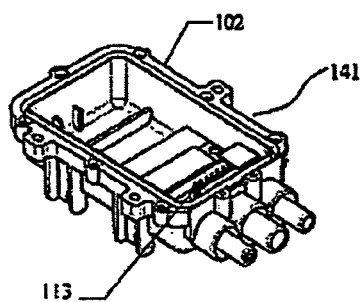
FIG. 4C shows the box body of the sealed box apparatus in FIG. 4A, in accordance with the present invention.
Figure 4D:
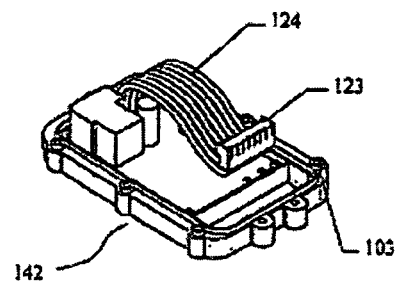
FIG. 4D shows the box cover of the sealed box apparatus in FIG. 4A, in accordance with the present invention.

When the sealed box of the present invention employs a non-unity design, in view of the fact that the electronic devices are contained therein it is very important that an airproof and a waterproof connection is provided between the box body and cover. FIGS. 4A, 4B, 4C and 4D illustrate the combination of each component of the waterproofing sealed box, in accordance with the present invention. As shown in FIG. 4A, the sealed box includes a box body 141 and a box cover 142, with a standard waterproof design, it further includes a slot 102 provided on the edge of the box body 141, while a corresponding slot 103 is provided on the box cover. The sealing piece 101 is compressed and sealed to form the sealed box with a waterproof seal by use of screws that are secured thereto. As shown in FIG. 4C, the sealed box is sealed after the wires of the electronic devices are connected. Only a wire socket 113 is positioned to be formed within the sealed box 141 for connection to the wires. In FIG. 4D, the box is sealed after the circuit board and heat elimination board are positioned therein. As illustrated in FIG. 4B, the wires 124 and the wire pin 123 are disposed within the box cover 142. The box body 141 and the box cover 142 are installed with a sealing piece 101 to form the sealed box.

Figure 5A:
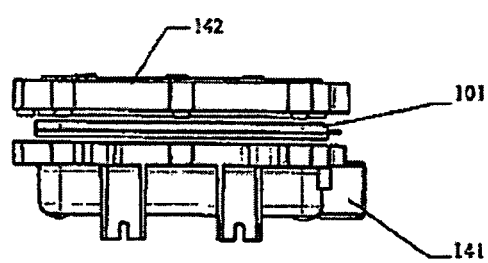
FIG. 5A is the top view of one embodiment before the box body, cover and sealing piece are sealed, in accordance with the present invention.
Figure 5B:
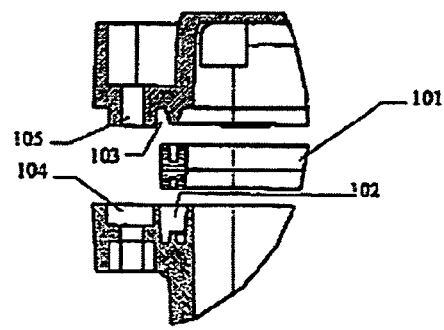
FIG. 5B is the sectional view of each part of FIG. 5A.
Figure 5C:
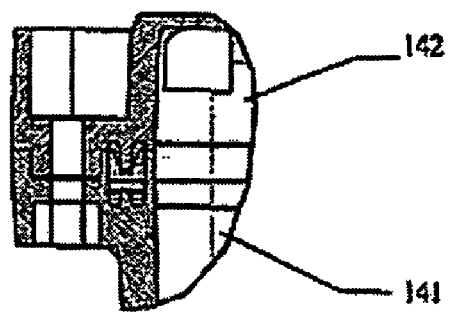
FIG. 5C is the side view of one embodiment before the box body, cover and sealing piece are sealed, in accordance with the present invention.

The sealing method of the box cover, box body and sealing piece is shown in FIGS. 5A to 5C. Sealing piece 101 may be any suitable material and must be suitable for the limited rigidity and the potential changing of the shape of the sealed box. In order to be suitable for this limited rigidity, the rigidity of a sealing piece used therein should be no more than ASTM ShoreA 90 degree, the ideal value is about 35 to 50 degree. The pressure direction of the sealing piece is parallel to the direction for opening and closing the box. Therefore, even if the sealed box is compressed, that is, a degree of shape changes occur that are different from the box body and box cover, the sealing piece still can compensate for this change in shape. The transverse section of the sealing piece is substantially an "H" shape with one slot on at least one side. Normally, the box cover and body of the sealed box bite into the sealing piece to be compressed on both sides to thus form the seal. However, when the shape of the plastic pieces change, with either being changed with respect to an inner or outer position, at least one side is compressed, thus the sealed box remains airproof.

In one embodiment of the present invention, one soft bar is employed. The transverse section of the soft bar is in substantially an "H" shape, and at least one side is provided with a slot. The transverse sections of the slots 102 and 103 are mated with the soft bar. An additional slot 104 may also be provided on the box body, and corresponds to the bulge 105 on the box cover 142 to enforce the ability of the sealed box to be airproof. While sealing, the soft bar 101 is compressed to fill the slot completely, then screws are drilled through the slots 104, 105 to enforce and fix the box body and cover of the sealed box, thus achieving an excellent sealing effect.

Figure 6A:
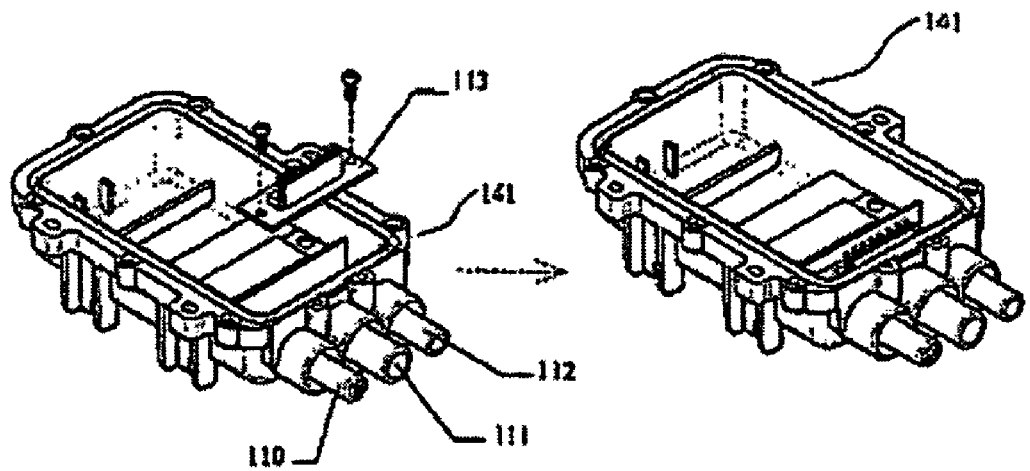
FIG. 6A shows the wire input/output portion of the box body in one embodiment, in accordance with the present invention.
Figure 6B:
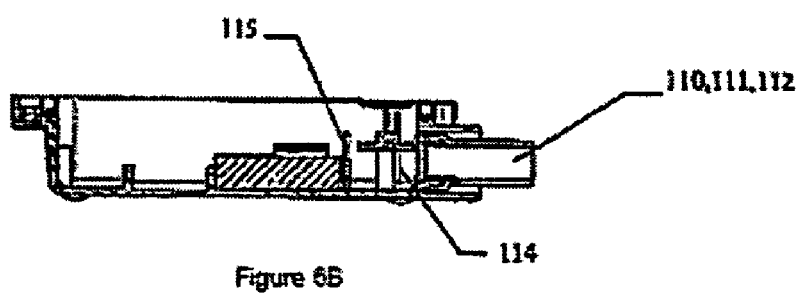
FIG. 6B is the side view of the box body of FIG. 6A, in accordance with the present invention.

As shown in FIGS. 6A and 6B, wires that connect the electronic devices within the sealed box and various apparatus outside the cleaning machine are input/output via multiple water leak preventing input/output tubes 110, 111 and 112 installed on the sealed box body 141. In addition to providing a standard water leak preventing apparatus when peripheral wires enter the sealed box, a wire socket and wire pin are provided within the box body for the inputting wire. As shown in FIGS. 6A and 6B, wires are input via wire tubes 110, 111 and 112. Base on the requirements of the design, input wires are positioned in the wire socket 113. After the wires are arranged, this portion will be sealed. Therefore, when the wire covers of wire tubes 110, 111 and 112 leak, and sealing material will protect the connection ends of the wires to prevent water from leaking into the circuit board. A transverse section of the box body 141 is illustrated in FIG. 6B. A wall 115 is provided at the position which corresponds to input/output wire tubes 110, 111 and 112 as the connection part of peripheral wires and inner wires. Thus, the sealed box is sealed to provide an airproof seal.

One of the key points with regard to the sealed box being waterproof is the input peripheral wires and exported inner wires. If the wires are not continuous, the soldering part should be sealed. Such soldering may be a direct solder of two wires. Alternatively, the soldering may be one or more solders via boards. The first solder point entering the sealed box should be sealed. On the other hand, an input peripheral wire and an exported inner wire may be the same wire. However, an insulating layer should be peeled from the wire, thus the peeled part should be sealed. In the above two processing methods, the purposes are the same, which is assuming that the sealed box will be airproof with respect to the entering part of the wire being damaged, or the cover of the wire being damaged. Thus, water will not leak into the electronic equipment of the sealed box.

Figure 7A:
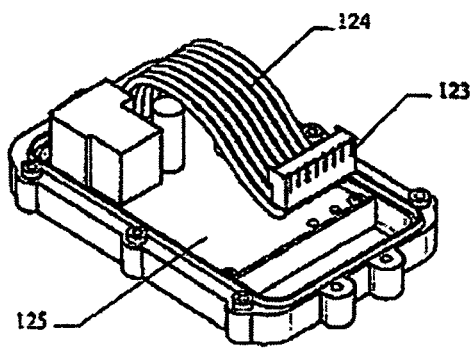
FIG. 7A is the up-side-down perspective view of the box cover in one embodiment, in accordance with the present invention.
Figure 7B:
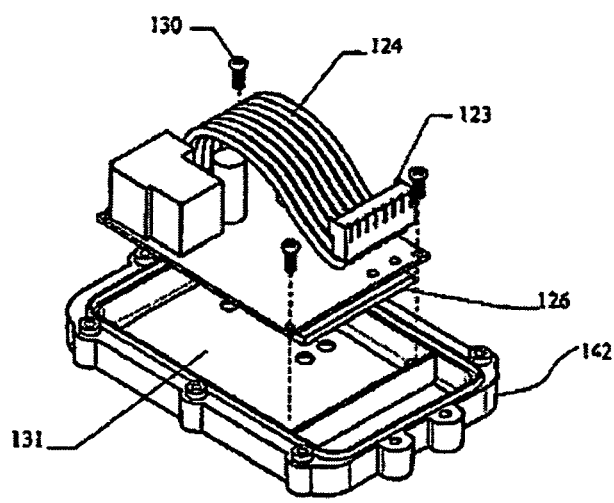
FIG. 7B is the exploded perspective view of FIG. 7A, in accordance with the present invention.
Figure 7C:
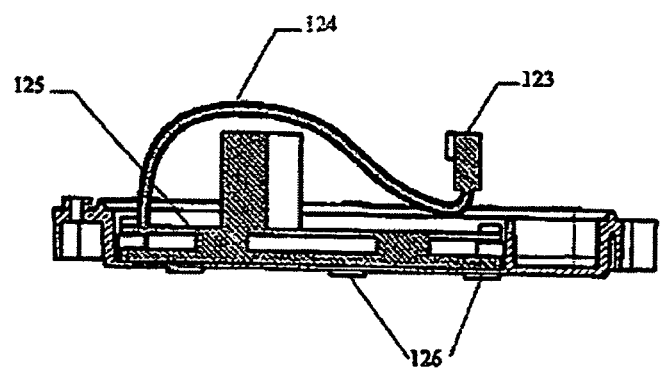
FIG. 7C is the side view of FIG. 7A, in accordance with the present invention.

The installation position of the circuit board and the heat elimination apparatus are illustrated in FIGS. 7A to 7C. Related electronic circuits are installed on a circuit board 125. Wires used as leading wires to peripheral circuits may be connect to wire pin 123 with a balance wire 124. The pin 123 matches the sealed box body socket 113. At least one heat elimination piece 126 is installed in contact with circuit board 125. The heat elimination board may be a large aluminum board, or other metal with an excellent heat elimination ability. More particularly, a metal with a low specific heat capacity. If the heat elimination board is made of metal, then materials with a high resistance are provided to divide the circuit board 125 and the metal. The circuit 125 and heat elimination board 126 is fixed on the box cover 142 with a screw 130, and then is sealed to enforce that the sealed box will be airproof.

Further, in order to expedite and equally share the heat elimination, so as to prevent the sealed box from changing its shape due to a long lasting heat, the heat elimination board 126 is closely mounted to the top cover portion 131 of the box cover 142. In a preferred embodiment, the thickness of the wall of the top cover portion near the heat elimination board is thicker than other walls of the box, thus to easily expedite the transfer of heat from the sealed box to water. Further, since the surface area of the heat elimination board is large, the heat elimination efficiency is increased. Therefore, the transforming and aging of the plastic caused by heat may be prevented.

In conclusion, the sealed box in the present invention provides an excellent sealed box that is airproof. Any potential water leaking may be conveniently monitored. Thus, the sealed box can be replaced and repaired before the electronic devices in the sealed box are damaged. The sealed box is very suitable for pool cleaning machines that are normally used under water.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention is not limited to the particular embodiment disclosed, but that the present invention will include all embodiments falling within the scope of the appended claims.

What is claimed is:

1. A sealed box apparatus for a machine used underwater wherein the sealed box is installed inside a body of the machine, comprising:
   a box for containing and sealing electronic devices for operating the cleaning machine;
   at least one waterproofed tube for inputting and outputting wires, said at least one waterproofed tube permitting ingress and egress of the inputting and outputting wires for connecting the electronic devices sealed inside the box with peripherals;
   a transparent portion, installed on one side of said box; and
   a humidity display, installed inside said box, said humidity display corresponding to the position of said transparent portion.

2. The sealed box according to claim 1, wherein said humidity display is a humidity displaying paper.

3. The sealed box according to claim 2, wherein said humidity display paper includes a high sensitivity humidity displaying paper and a low sensitivity humidity displaying paper.

4. The sealed box according to claim 1, wherein said humidity display is a hygrometer.

5. The sealed box according to claim 1, wherein said box is made of transparent material.

6. The sealed box according to claim 1, wherein a control switch is fixed on said box for controlling the electronic devices sealed inside the box.

7. The sealed box according to claim 1, wherein said box is of an integral design.

8. The sealed box according to claim 1, wherein said box includes a box body and a box cover, wherein the body and cover are sealed together.

9. A sealed box apparatus for a pool cleaning machine, which is installed inside a body of a pool cleaning machine, comprising:
   a box for containing and sealing electronic devices of the cleaning machine, including:
      a box body, and
      a box cover, said box body and said box cover being hermetically engaged;
   at least one waterproofed tube operatively connected to the box for inputting and outputting wires for connecting the electronic devices sealed inside the box with peripherals;
   a transparent portion, installed on one side of said box;
   a humidity display, installed inside said box, said humidity display being positioned to correspond to the position of said transparent portion; and
   at least one heat elimination board installed in the body for eliminating the heat generated by the electronic devices inside the box body.

10. The sealed box according to claim 9, wherein a slot is provided on the edge of the box body, a matching slot is also provided on the corresponding position of the box cover, and a sealing piece is provided at the copulae of the box body and box cover, and a reinforcing screw for ensuring the sealing engagement of the body and cover.

11. The sealed box according to claim 10, wherein the rigidity of said sealing piece is no more than ASTM ShoreA 90 degree.

12. The sealed box according to claim 11, wherein the rigidity of said sealing piece is between ASTM ShoreA 35~50 degree.

13. The sealed box according to claim 10, wherein the transverse section of said sealing piece is substantially in the shape of an "H" and at least one side of the sealing piece is provided with a slot.

14. The sealed box according to claim 10, wherein a circuit motherboard, a wire, a wire socket, a wire pin and a heat elimination board are installed inside the sealed box; the motherboard and heat elimination board are sealed to seal the circuit therein after been installed; the wire, wire pin and wire socket are using for connecting the motherboard and the wire that enters the sealed box via wire input/output tube.

15. The sealed box according to claim 9, wherein a circuit motherboard, a wire, a wire socket, a wire pin and a heat elimination board are installed inside the sealed box; the motherboard and heat elimination board are sealed to seal the circuit therein after been installed; the wire, wire pin and wire socket are using for connecting the motherboard and the wire that enters the sealed box via wire input/output tube.

16. The sealed box according to claim 15, and further including a wall corresponding to the position of wire input/output tube, said wall being provided in the box body with a small space being formed between the wall and the one side of the body as a connection space for inputting a wire from outside and outputting a wire from inside; and once installed the wires are sealed within the space.

17. The sealed box according to claim 16, wherein the wire input from outside and the wire output from inside are non-continuous wires, with their soldered portion be sealed after being soldered together.

18. The sealed box according to claim 16, wherein the wire input from outside and the wire output from inside are continuous wires, with their insulating layer being peeled, and the peeled portion then be sealed.

19. The sealed box according to claim 9, wherein said heat elimination board lies on the wall of the box body, and the wall of the box body that is adjacent to the heat elimination board is thinner relative to other walls thereby increasing the elimination of heat to water by the heat elimination board.

20. The sealed box according to claim 9, wherein said humidity display is a humidity displaying paper.

21. The sealed box according to claim 9, wherein said humidity display is a hygrometer.

22. The sealed box according to claim 9, wherein said box body is made of transparent material.

* * * * *